(12) United States Patent
Chou (10) Patent No.: US 11,183,423 B2
(45) Date of Patent: Nov. 23, 2021

(54) LINER STRUCTURE IN INTERLAYER DIELECTRIC STRUCTURE FOR SEMICONDUCTOR DEVICES

(71) Applicant: Taiwan Semiconductor Manufacturing Co., Ltd., Hsinchu (TW)

(72) Inventor: Chun Ting Chou, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 26 days.

(21) Appl. No.: 15/909,741

(22) Filed: Mar. 1, 2018

(65) Prior Publication Data
US 2019/0164819 A1 May 30, 2019

Related U.S. Application Data

(60) Provisional application No. 62/591,659, filed on Nov. 28, 2017.

(51) Int. Cl.
*H01L 21/78* (2006.01)
*H01L 21/768* (2006.01)
(Continued)

(52) U.S. Cl.
CPC ............ *H01L 21/76832* (2013.01); *H01L 21/02337* (2013.01); *H01L 21/32055* (2013.01);
(Continued)

(58) Field of Classification Search
CPC ......... H01L 29/66545; H01L 29/4966; H01L 21/76828; H01L 21/76825; H01L 21/02126; H01L 21/02348; H01L 29/0847; H01L 29/66795; H01L 29/785; H01L 21/823431; H01L 21/823437; H01L 21/76897; H01L 21/823821; H01L 27/0886; H01L 27/0924
See application file for complete search history.

(56) References Cited

U.S. PATENT DOCUMENTS 9,093,530 B2   7/2015   Huang et al.
9,171,929 B2   10/2015  Lee et al.
(Continued)

FOREIGN PATENT DOCUMENTS

KR   20010076938 A   8/2001
KR   20090008003 A   1/2009
(Continued)

*Primary Examiner* — Marcos D. Pizarro
*Assistant Examiner* — Quinton A Brasfield
(74) *Attorney, Agent, or Firm* — Slater Matsil, LLP (57) ABSTRACT

Semiconductor device structures having a liner layer in an interlayer dielectric structure are provided. In one example, a semiconductor device includes an active area on a substrate, the active area comprising a source/drain region, a gate structure over the active area, the source/drain region being proximate the gate structure, a spacer feature along a sidewall of the gate structure, a contact etching stop layer on the spacer feature, a liner oxide layer on the contact etching stop layer, and an interlayer dielectric layer on the liner oxide layer, wherein the liner oxide layer has an oxygen concentration level greater than the interlayer dielectric layer.

19 Claims, 9 Drawing Sheets

(51) Int. Cl.
*H01L 29/78* (2006.01)
*H01L 21/321* (2006.01)
*H01L 29/66* (2006.01)
*H01L 21/3205* (2006.01)
*H01L 21/02* (2006.01)
*H01L 29/165* (2006.01)

(52) U.S. Cl.
CPC .......... *H01L 21/32105* (2013.01); *H01L 29/66545* (2013.01); *H01L 29/66795* (2013.01); *H01L 29/7843* (2013.01); *H01L 29/7848* (2013.01); *H01L 29/7851* (2013.01); *H01L 29/165* (2013.01)

(56) References Cited

U.S. PATENT DOCUMENTS

| | | | |
|---|---|---|---|
| 9,214,555 B2 | 12/2015 | Oxland et al. | |
| 9,564,489 B2 | 2/2017 | Yeo et al. | |
| 9,601,342 B2 | 3/2017 | Lee et al. | |
| 9,608,116 B2 | 3/2017 | Ching et al. | |
| 9,685,319 B2 | 6/2017 | Huang et al. | |
| 9,768,278 B1 | 9/2017 | Chui et al. | |
| 9,870,944 B2 * | 1/2018 | Liou | H01L 23/5226 |
| 10,157,997 B2 * | 12/2018 | Hsieh | H01L 29/41791 |
| 10,211,314 B1 * | 2/2019 | Hsu | H01L 21/31053 |
| 2001/0048146 A1 * | 12/2001 | Wen | H01L 23/3171 257/639 |
| 2007/0224772 A1 * | 9/2007 | Hall | H01L 21/76283 438/400 |
| 2008/0054480 A1 * | 3/2008 | Shim | H01L 23/5283 257/773 |
| 2009/0017630 A1 * | 1/2009 | Lee | H01L 21/823871 438/702 |
| 2009/0020820 A1 | 1/2009 | Baik et al. | |
| 2013/0040455 A1 * | 2/2013 | Chan | H01L 21/28088 438/653 |
| 2014/0048912 A1 | 2/2014 | Hohage et al. | |
| 2015/0200127 A1 * | 7/2015 | Chuang | H01L 29/0642 257/622 |
| 2017/0033179 A1 * | 2/2017 | Lin | H01L 21/324 |
| 2017/0053916 A1 | 2/2017 | Ching et al. | |
| 2017/0194320 A1 | 7/2017 | Chen et al. | |
| 2018/0277482 A1 * | 9/2018 | Briggs | H01L 21/76816 |

FOREIGN PATENT DOCUMENTS

| | | |
|---|---|---|
| KR | 20100036098 A | 4/2010 |
| KR | 20140023210 A | 2/2014 |
| KR | 101465703 B1 | 11/2014 |

\* cited by examiner

LINER STRUCTURE IN INTERLAYER DIELECTRIC STRUCTURE FOR SEMICONDUCTOR DEVICES

PRIORITY CLAIM AND CROSS-REFERENCE

This application claims the benefit of and priority to U.S. Provisional Patent Application Ser. No. 62/591,659, filed on Nov. 28, 2017, entitled "LINER STRUCTURE IN INTERLAYER DIELECTRIC STRUCTURE FOR SEMICONDUCTOR DEVICES," which is incorporated herein by reference in its entirety.

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin structure extending from a substrate, for example, by etching into a silicon layer of the substrate. The channel of the FinFET is formed in the vertical fin. A gate structure is provided over (e.g., overlying to wrap) the fin structure. It is beneficial to have a gate structure on the channel allowing gate control of the channel around the gate structure. FinFET devices provide numerous advantages, including reduced short channel effects and increased current flow.

As the device dimensions continue scaling down, FinFET device performance can be improved by using a metal gate electrode instead of a typical polysilicon gate electrode. One process of forming a metal gate stack is forming a replacement-gate process (also called as a "gate-last" process) in which the final gate stack is fabricated "last". However, there are challenges to implement such IC fabrication processes in advanced process nodes. Inaccurate and improper control of the deposition and patterning process during the gate fabrication may adversely deteriorate electrical performance of the device structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to replacement gates formed in semiconductor devices. The present disclosure provides methods for manufacturing a liner layer in an interlayer dielectric (ILD) structure in a replacement gate manufacturing processes. The liner layer is formed on a contact etching stop layer (CESL) and below an interlayer dielectric (ILD) layer in the interlayer dielectric (ILD) structure. Some examples described herein are in the context of FinFETs. Example embodiments described herein are described in the context of forming the liner layer on the CESL prior to an interlayer dielectric (ILD) layer formed thereon. Implementations of some aspects of the present disclosure may be used in other processes, in other devices, and/or for other layers. For example, other example devices can include planar FETs, Horizontal Gate All Around (HGAA) FETs, Vertical Gate All Around (VGAA) FETs, and other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

In a replacement gate process for forming a metal gate for a transistor, a dummy gate stack is formed over a substrate as a placeholder for an actual gate stack later formed thereon. A spacer feature is formed surrounding the dummy gate stack. After a source/drain region is formed, the CESL, the liner layer of the present disclosure, and the interlayer dielectric (ILD) layer are formed on the liner layer. Subsequently, the dummy gate stack is removed, leaving an opening surrounded by the spacer feature, CESL, liner layer, and ILD layer. Then, a metal gate is formed in the opening defined by the spacer feature, CESL, liner layer, and ILD.

The metal gate structure includes a gate dielectric layer, such as a high-k dielectric layer, an optional barrier layer, a capping layer, a work function tuning layer and a gate metal electrode. Multiple deposition and patterning processes may be used to form the layer, for example, to fine tune threshold voltage (Vt) of the transistor. In some embodiments, the layer may utilize different materials for different types of transistors, such as p-type FinFET or n-type FinFET, so as to enhance device electrical performance as needed. The capping layer is optionally used to protect the gate dielectric layer during the patterning processes. However, the gate dielectric layer and the optional barrier layer may be inadvertently etched by some cleaning and/or etching processes. As a result, the gate dielectric layer and the optional barrier layer may lose their effectiveness and functions in the metal gate structure. Embodiments of the present disclosure may address such an issue.

Figure 1:
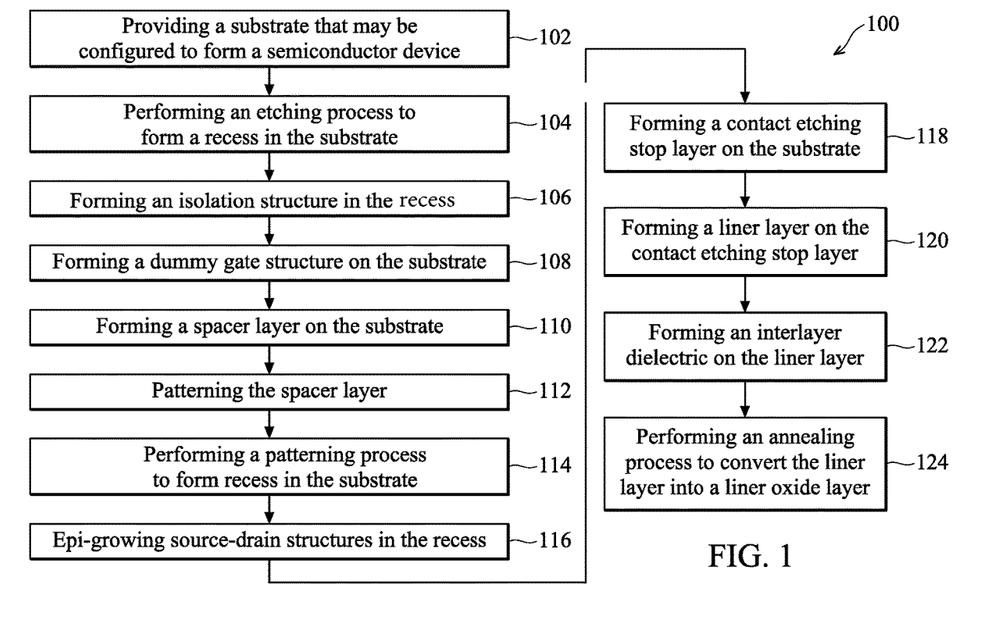
FIG. 1 is a flow chart of an exemplary process for manufacturing a device structure on a substrate in accordance with some embodiments.
Figure 2:
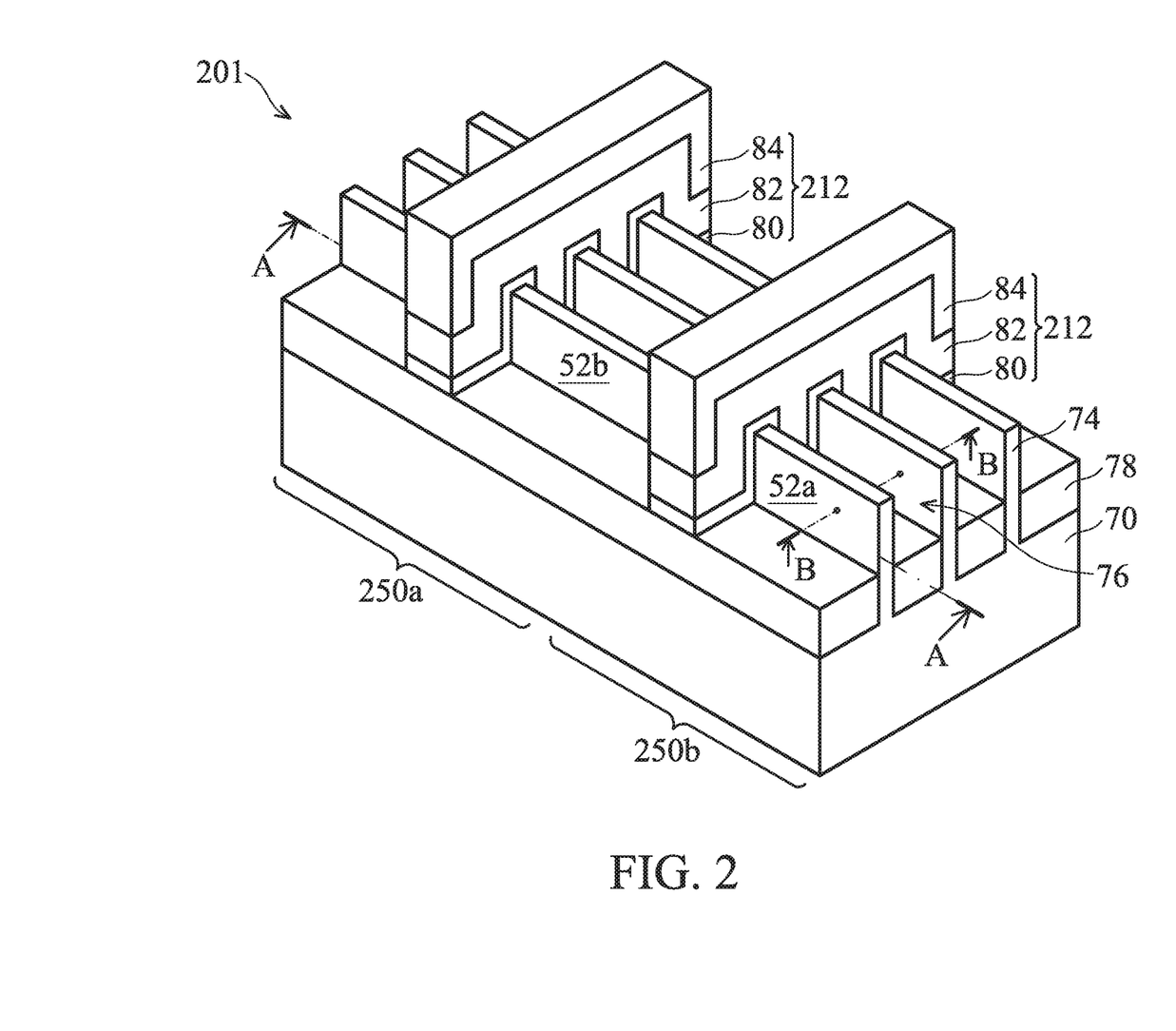
FIG. 2 depicts a perspective view of a semiconductor device structure in accordance with some embodiments.

FIG. 1 depicts an exemplary flow diagram of a process 100 performed to form a semiconductor device structure, such as a simplified FINFET device structure 201 depicted in FIG. 2. Other aspects not illustrated in or described with respect to FIG. 2 may become apparent from the following figures and description. The structure in FIG. 2 may be electrically connected or coupled in a manner to operate as, for example, one transistor or more. FIGS. 3A-16B are schematic cross-sectional views of a portion of the substrate corresponding to various stages of the process 100 in accordance with some embodiments. It is noted that the process 100 may be utilized to form any suitable structures, including the semiconductor device structure 201 depicted in FIGS. 2-16B or other semiconductor structures not presented herein.

The simplified FINFET device structure 201 depicted in FIG. 2 is formed on a substrate 70. The substrate 70 can be or include a bulk semiconductor substrate, a semiconductor-on-insulator (SOI) substrate, or another substrate. The semiconductor material of the substrate 70 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 70, the substrate 70 may include semiconductor material disposed on an insulator layer, which may be a buried insulator disposed in a semiconductor substrate, or which may be a glass or sapphire substrate. In embodiments depicted herein, the substrate 70 is a silicon containing material, such as a crystalline silicon substrate. Moreover, the substrate 70 is not limited to any particular size, shape, or materials. The substrate 70 may be a round/circular substrate having a 200 mm diameter, a 300 mm diameter, or other diameters, such as 450 mm, among others. The substrate 70 may also be any polygonal, square, rectangular, curved, or otherwise non-circular workpiece, such as a polygonal substrate as needed.

Each fin structure 74 provides an active region where one or more devices are formed. The fin structures 74 are fabricated using suitable processes including masking, photolithography, and/or etch processes. In an example, a mask layer is formed overlying the substrate 70. The photolithography process includes forming a photoresist layer (resist) overlying the mask layer, exposing the photoresist layer to a pattern, performing a post-exposure bake process, and developing the photoresist layer to pattern the photoresist layer. The pattern of the photoresist layer is transferred to the mask layer using a suitable etch process to form a masking element. The masking element may then be used to protect regions of the substrate 70 while an etch process forms recesses 76 into the substrate, leaving an extending fin, such as the fin structures 74. The recesses 76 may be etched using reactive ion etch (RIE) and/or other suitable processes. Numerous other embodiments of methods to form a fin structure on a substrate may be utilized.

In an embodiment, the fin structures 74 are approximately 10 nanometer (nm) wide and in a range from approximately 10 nm to 60 nm in height, such as about 50 nm high. However, it should be understood that other dimensions may be used for the fin structures 74. In one example, the fin structures 74 comprise silicon materials or another elementary semiconductor, such as germanium, or a compound semiconductor including silicon carbide, gallium arsenic, gallium phosphide, indium phosphide, indium arsenide, and/or indium antimonide. The fin structures 74 may also be an alloy semiconductor including SiGe, GaAsP, AlInAs, AlGaAs, GaInAs, GaInP, GaInAsP, or a combination thereof. Further, the fin structures 74 may be doped using n-type and/or p-type dopants as needed.

As described, in an example, the plurality of fin structures 74 may be formed by etching a portion of the substrate 70 away to form recesses 76 in the substrate 70. The recesses 76 may then be filled with isolating material that is recessed or etched back to form isolation structures 78. Other fabrication techniques for the isolation structures 78 and/or the fin structure 74 are possible. The isolation structures 78 may isolate some regions of the substrate 70, e.g., active areas in the fin structures 74. In an example, the isolation structures 78 may be shallow trench isolation (STI) structures and/or other suitable isolation structures. The STI structures may be formed of silicon oxide, silicon nitride, silicon oxynitride, fluoride-doped silicate glass (FSG), a low-k dielectric material, and/or other suitable insulating material. The STI structures may include a multi-layer structure, for example, having one or more liner layers.

A dummy gate structure 212 is formed over the fin structures 74. In the example depicted in FIG. 2, the dummy gate structure 212 includes a gate dielectric layer 80, a gate electrode layer 82, and a hard mask 84. It is noted that the dummy gate structure 212 may further include a capping layer and/or other suitable layers. The various layers in the dummy gate structure 212 may be formed by suitable deposition techniques and patterned by suitable photolithography and etching techniques. The dummy gate structure 212 engages the fin structures 74 on two or three sides of the fin structure 74. Source/drain regions 52a and 52b are disposed in opposing regions of the fin structure 74 with respect to the dummy gate structure 212. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 52a, 52b are electrically connected, such as through coalescing the regions by epitaxial growth (e.g., source/drain regions 52a and 52b being coalesced), two functional transistors may be implemented. Other configurations in other examples may implement other numbers of functional transistors.

The term, "dummy", as described here, refers to a sacrificial structure which will be removed in a later stage and will be replaced with another structure, such as a high-k dielectric and metal gate structure in a replacement gate process. The replacement gate process refers to manufacturing a gate structure at a later stage of the overall gate manufacturing process. The gate dielectric layer 80 can be a dielectric oxide layer. For example, the dielectric oxide layer may be formed by chemical oxidation, thermal oxidation, atomic layer deposition (ALD), chemical vapor deposition (CVD), and/or other suitable methods. The gate electrode layer 82 may be a poly-silicon layer or other suitable layers. For example, the gate electrode layer 82 may be formed by suitable deposition processes such as low-pressure chemical vapor deposition (LPCVD) and plasma-enhanced CVD (PECVD). The hard mask 84 may be any material suitable to pattern the gate electrode layer 82 with desired features/dimensions on the substrate.

In an embodiment, the various layers of the dummy gate structure 212 are first deposited as blanket layers. Then, the blanket layers are patterned through a process including photolithography and etching processes, removing portions of the blanket layers and keeping the remaining portions over the isolation structures 78 and the fin structures 74 to form the dummy gate structure 212.

In an example, the semiconductor device structure 201 includes a p-type device region 250*a* and an n-type device region 250*b*. One or more p-type devices, such as p-type FinFETs, may be formed in the p-type device region 250*a*, and one or more n-type devices, such as n-type FinFETs, may be formed in the n-type device region 250*b*. The semiconductor device structure 201 may be included in an IC such as a microprocessor, memory device, and/or other IC.

FIG. 2 further illustrates reference cross-sections that are used in later figures. Cross-section A-A is in a plane along, e.g., channels in the fin structure 74 between opposing source/drain regions 52*a*, 52*b*. Cross-section B-B is in a plane perpendicular to cross-section A-A and is across source/drain region 52*a* in fin structure 74. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

Figure 3A:
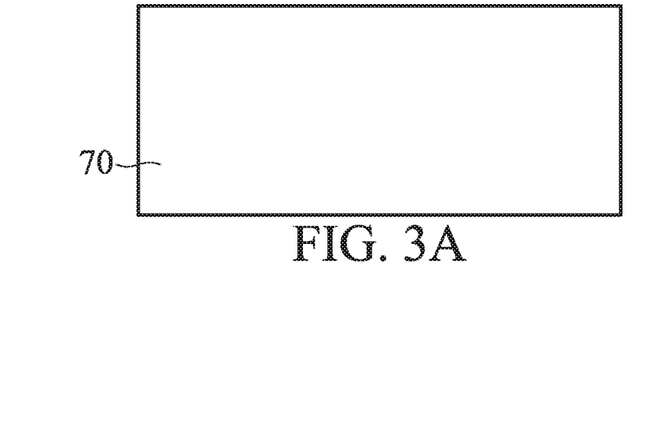
FIGS. 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B and 16A-16B depict cross-sectional views of the semiconductor device structure at different manufacturing stages of FIG. 1 in accordance with some embodiments.
Figure 3B:
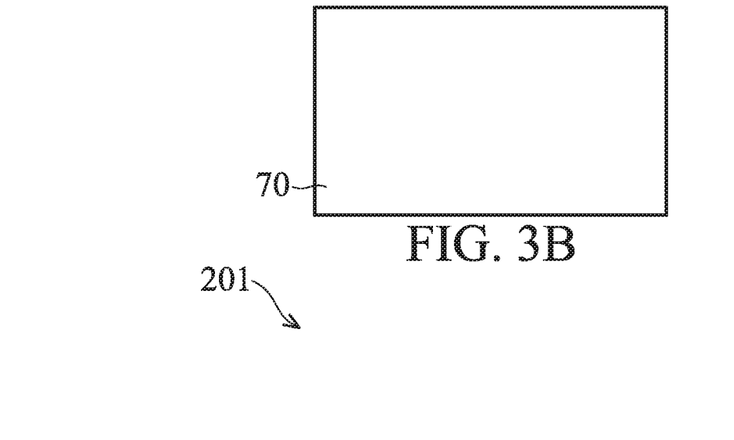

Referring back to the process 100 depicted in FIG. 1, the process 100 begins at operation 102 by providing the substrate 70, as depicted in FIGS. 3A-3B, ready for manufacturing a semiconductor device, such as the semiconductor device 201, to be formed on the substrate 70.

Figure 4A:
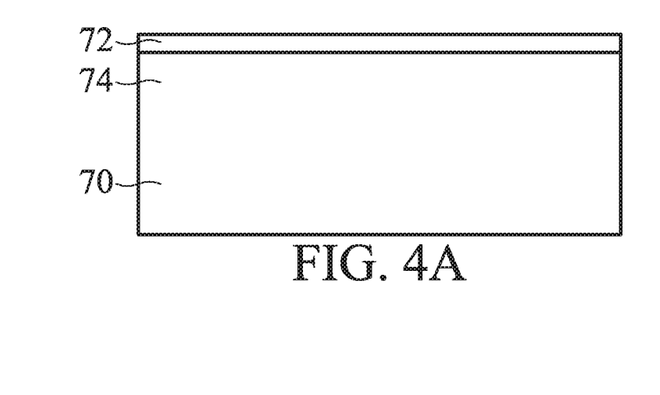
Figure 4B:
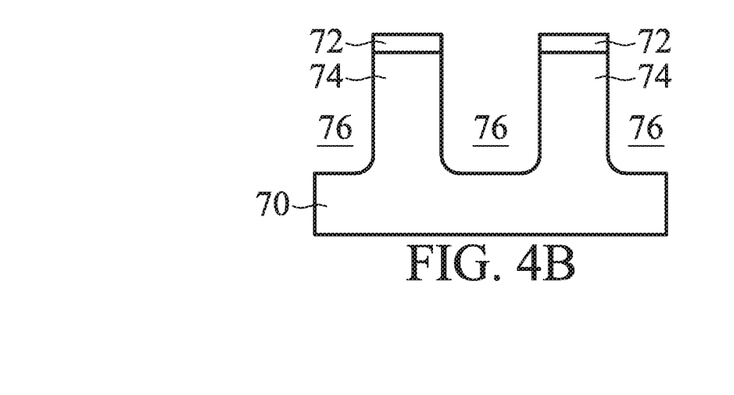

At operation 104, an etching process is performed to form a recess 76 in the substrate 70 defining the fin structures 74 in the substrate 70, as shown in FIGS. 4A-4B. A mask 72 (e.g., a hard mask) is used to facilitate forming the fin structures 74 in the substrate 70. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), inductive coupled plasma (ICP) etch, the like, or a combination thereof. The etching may be anisotropic. Subsequently, the photo resist is removed in an ashing or wet strip processes, for example.

Figure 5A:
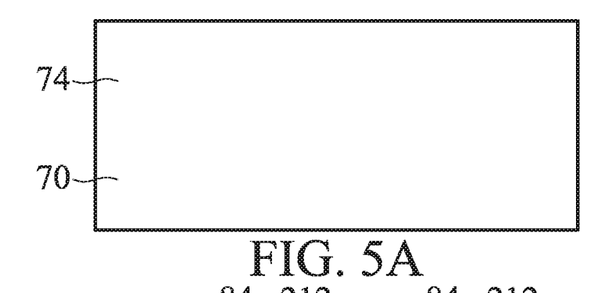
Figure 5B:
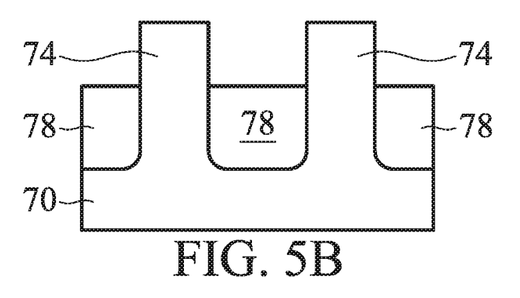

At operation 106, an isolation structure 78 is formed in the recess 76 each in a corresponding recess 76, as shown in FIGS. 5A-5B. The isolation structure 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation structure 78 includes silicon oxide that is formed by a FCVD process. A planarization process, such as a Chemical Mechanical Polish (CMP), may remove any excess insulating material and any remaining mask (e.g., used to etch the recess 76 and form the fin structures 74) to form top surfaces of the insulating material and top surfaces of the fin structures 74 to be substantially coplanar. The insulating material may then be recessed to form the isolation structure 78. The insulating material is recessed such that the fin structures 74 protrude from between neighboring isolation structures 78, which may, at least in part, thereby delineate the fin structures 74 as active areas on the semiconductor substrate 70. The insulating material may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation structures 78 may have a flat surface as illustrated, a convex surface, a concave surface (such as dishing), or a combination thereof, which may result from an etch process.

Figure 6A:
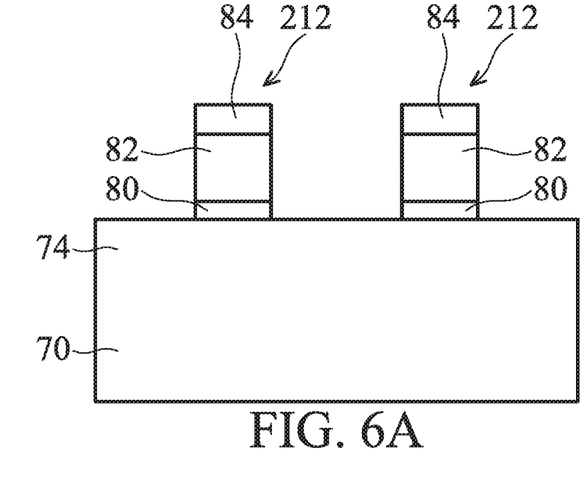
Figure 6B:
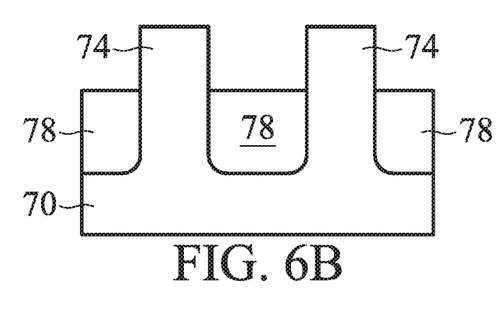

At operation 108, a dummy gate structure 212 is formed on the substrate, as depicted in FIGS. 6A-6B. The dummy gate structure 212 is over and extends laterally perpendicularly to the fin structures 74. Each gate structure comprises a gate dielectric layer 80, a gate electrode layer 82, and a hard mask 84. Although the dummy gate structure 212 is illustrated to be used in a replacement gate process, it is noted that other types of the gate structures may also be used for other types of the processes, such as a gate-first process.

In one embodiment, the gate dielectric layer 80, the gate electrode layer 82 and the hard mask 84 may be formed by sequentially forming respective layers, and then patterning those layers into the dummy gate structure 212. For example, a layer for the gate dielectrics may include or be silicon oxide, silicon nitride, a high-k dielectric material, the like, or multilayers thereof. A high-k dielectric material can have a k value greater than about 7.0, and may include a metal oxide or silicate of Hf, Al, Zr, La, Mg, Ba, Ti, Pb, multilayers thereof, or a combination thereof. The layer for the gate dielectrics may be thermally and/or chemically grown on the fin structure 74, or conformally deposited, such as by plasma-enhanced CVD (PECVD), ALD, molecular-beam deposition (MBD), or another deposition technique. A layer for the gate electrodes may include or be silicon (e.g., polysilicon, which may be doped or undoped), a metal-containing material (such as titanium, tungsten, aluminum, ruthenium, or the like), or a combination thereof (such as a silicide or multiple layers thereof). The layer for the gate electrodes may be deposited by CVD, PVD, or another deposition technique. A layer for the hard mask 84 may include or be silicon nitride, silicon oxynitride, silicon carbon nitride, the like, or a combination thereof, deposited by CVD, PVD, ALD, or another deposition technique. The layers for the hard mask 84, gate electrode layer 82, and gate dielectric layer 80 may then be patterned, for example, using photolithography and one or more etch processes, like described above, to form the hard mask 84, gate electrode layer 82, and gate dielectric layer 80 for each gate stack.

In a replacement gate process, the gate dielectric layer 80 may be an interfacial dielectric. The gate dielectric layer 80, the gate electrode layer 82 and the hard mask 84 for the dummy gate structure 212 may be formed by sequentially forming respective layers, and then patterning those layers into the gate stacks. For example, a layer for the interfacial dielectrics may include or be silicon oxide, silicon nitride, the like, or multilayers thereof, and may be thermally and/or chemically grown on the fin structure 74, or conformally deposited, such as by PECVD, ALD, or another deposition technique. A layer for the gate electrode layer 82 may include or be silicon (e.g., polysilicon) or another material deposited by CVD, PVD, or another deposition technique. A layer for the hard mask 84 may include or be silicon nitride, silicon oxynitride, silicon carbon nitride, the like, or a combination thereof, deposited by CVD, PVD, ALD, or another deposition technique. The layers for the hard mask 84, gate electrode layer 82, and the gate dielectric layer 80 may then be patterned, for example, using photolithography and one or more etch processes, like described above, to form the hard mask 84, gate electrode layer 82, and gate dielectric layer 80 for each dummy gate structure 212.

In some embodiments, after forming the dummy gate structure 212, lightly doped drain (LDD) regions (not specifically illustrated) may be formed in the active areas. For example, dopants may be implanted into the active areas (e.g., fin structures 74) using the gate stacks as masks. Example dopants can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

Figure 7A:
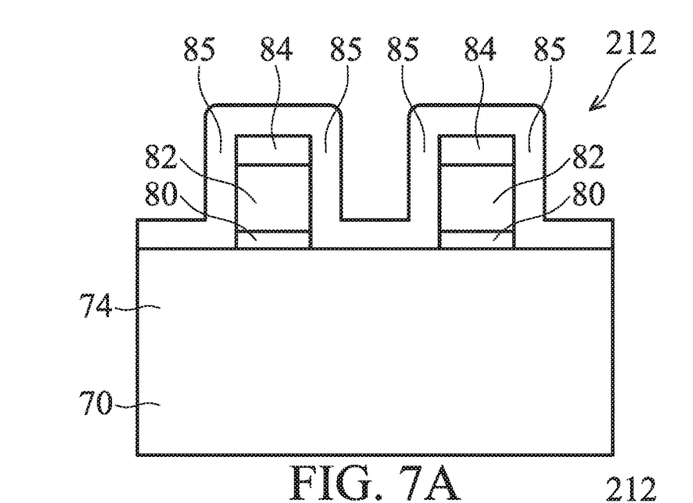
Figure 7B:
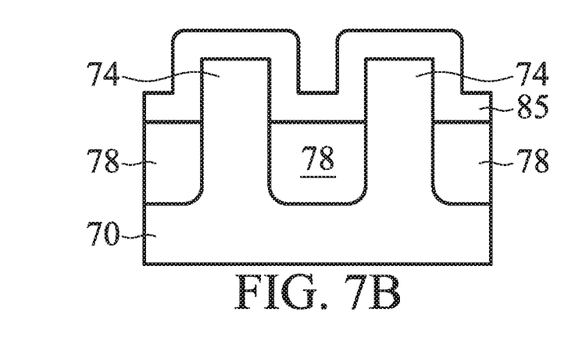

At operation 110, a spacer layer 85 is formed on sidewalls of the dummy gate structure 212, as shown in FIG. 7A-7B. The one or more spacer layers 85 are formed conformally on the substrate. The one or more spacer layers 85 include a material different from the material(s) for the dummy gate structure 212. In one example, the one or more spacer layers 85 may include or may be silicon carbon oxide, silicon nitride, silicon oxynitride, silicon carbon nitride, the like, multi-layers thereof, or a combination thereof, and may be deposited by CVD, ALD, or another deposition technique.

Figure 8A:
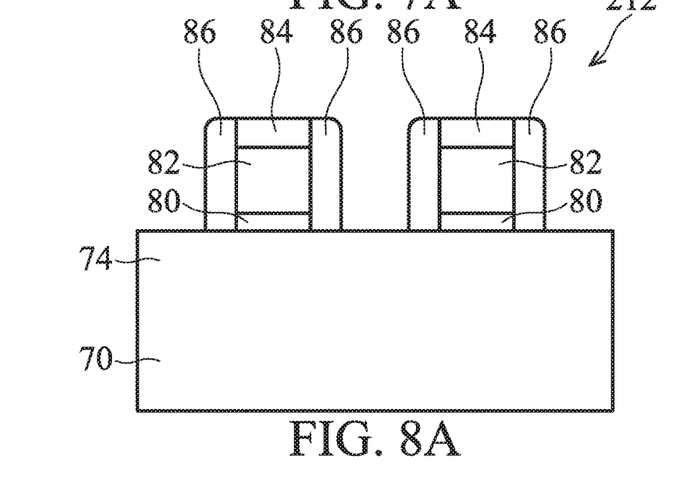
Figure 8B:
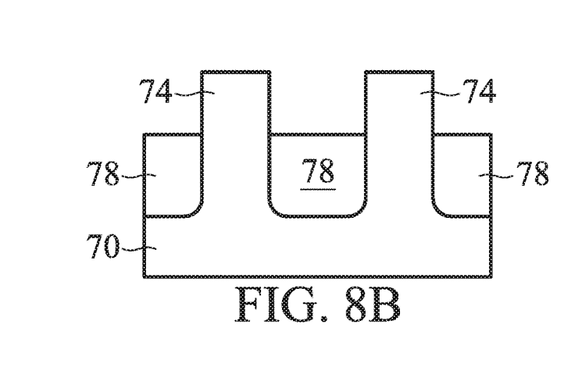

At operation 112, the one or more spacer layers 85 are then anisotropically etched to form a desired profile of a spacer feature 86, as shown in FIGS. 8A-8B. The resultant spacer feature 86 may be formed along the sidewalls of the dummy gate structure 212 (e.g., sidewalls of the gate dielectric layer 80, gate electrode layer 82, and hard mask 84) as well as along the sidewalls of the fin structures 74, for example, depending on the height of the fin structure 74 above the isolation structure 78. The etch process can include a RIE, NBE, or another etch process. In an embodiment, the spacer feature 86 includes a dielectric material, such as silicon nitride or silicon oxynitride.

Figure 9A:
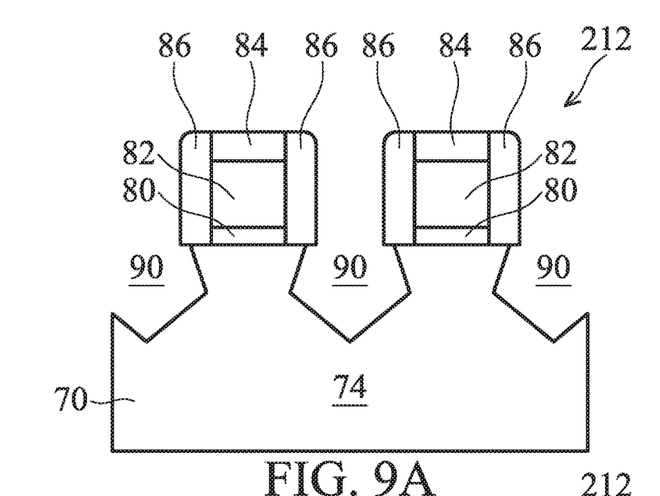
Figure 9B:
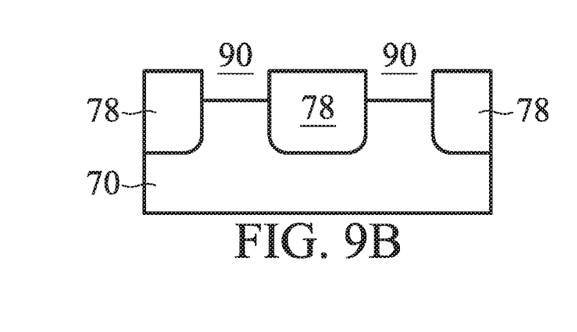

At operation 114, recesses 90 are formed in the substrate 70 for source/drain regions, as shown in FIGS. 9A-9B. As illustrated, the recesses 90 are formed in the fin structure 74 on opposing sides of the dummy gate structure 212. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethylammonium hydroxide (TMAH), ammonium hydroxide (NH$_4$OH), or another etchant.

Figure 10A:
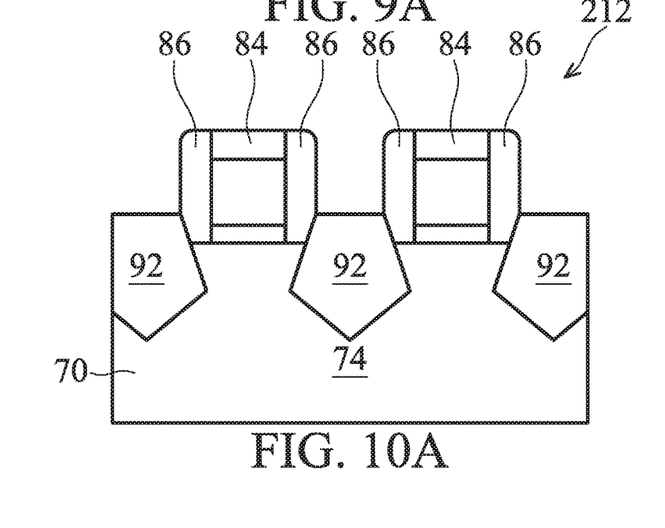
Figure 10B:
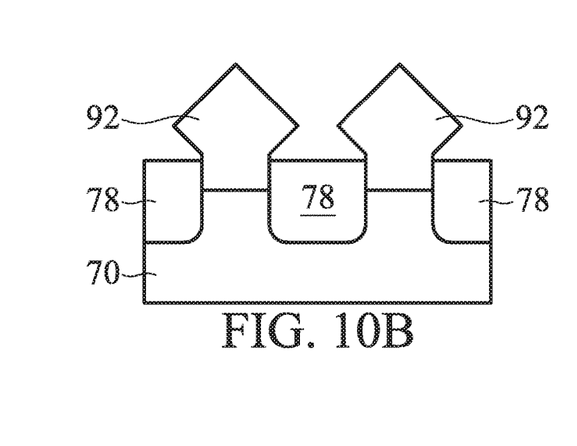

At operation 116, after the recesses 90 are formed in the substrate 70, an epitaxy deposition process may be performed to grow source/drain regions 92, as shown in FIGS. 10A-10B. The epitaxy source/drain regions 92 may include or be silicon germanium (Si$_x$Ge$_{1-x}$, where x can be between approximately 0 and 1), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 10A-10B, due to blocking by the isolation structures 78, the epitaxy source/drain regions 92 are first grown vertically in recesses 90, during which time the epitaxy source/drain regions 92 do not grow horizontally. After the recesses 90 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 9A-9B and 10A-10B may be omitted, and that source/drain regions may be formed by implanting dopants into the fin structures 74 using the dummy gate structure 212 and spacer feature 86 as masks. In some examples where epitaxy source/drain regions 92 are implemented, the epitaxy source/drain regions 92 may also be doped, such as by in-situ doping during epitaxial growth and/or by implanting dopants into the epitaxy source/drain regions 92 after epitaxial growth. Example dopants can include or be, for example, boron for a p-type device and phosphorus or arsenic for an n-type device, although other dopants may be used. The epitaxy source/drain regions 92 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 11A:
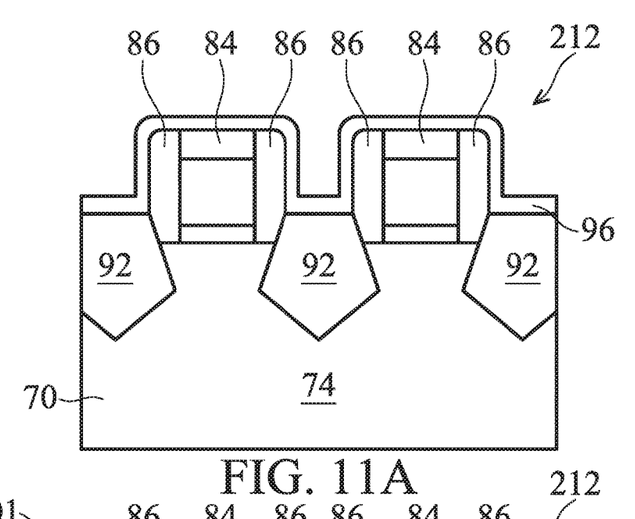
Figure 11B:
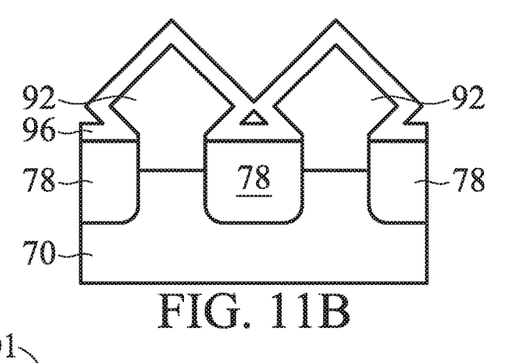

At operation 118, a contact etching stop layer (CESL) 96 is formed covering the dummy gate structure 212, as shown in FIGS. 11A-11B. The CESL 96 can provide a mechanism to stop an etch process when forming, e.g., contacts or vias. The contact etch stop layer 96 may be formed of a dielectric material having a different etch selectivity from adjacent layers or components. The CESL 96 is formed on surfaces of the epitaxy source/drain regions 92, sidewalls and top surfaces of the spacer feature 86, top surfaces of the hard mask 84, and top surfaces of the isolation structures 78. The CESL 96 may comprise or may be a nitrogen containing material, a silicon containing material, and/or a carbon containing material. Furthermore the CESL 96 may comprise or may be silicon nitride, silicon carbon nitride, carbon nitride, silicon oxynitride, silicon carbon oxide, the like, or a combination thereof. The CESL 96 may be deposited by a deposition process, such as a Plasma Enhanced ALD (PEALD), CVD, or another deposition technique.

Figure 12A:
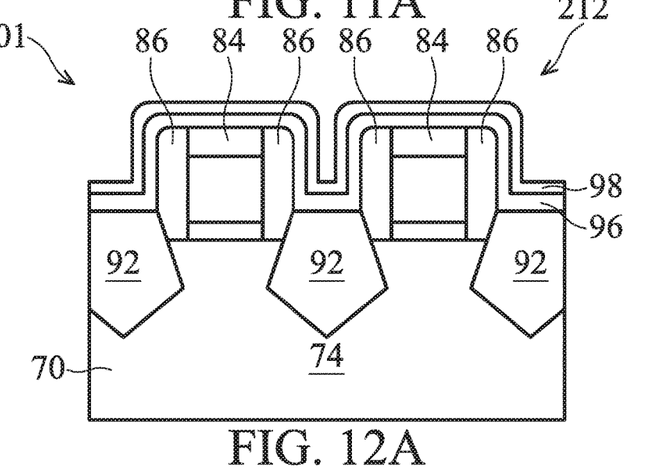
Figure 12B:
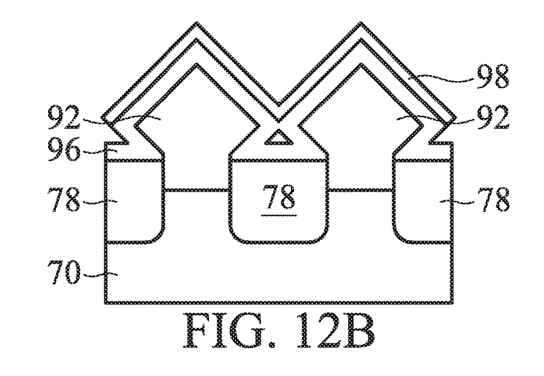

At operation 120, a liner layer 98 is then formed on the CESL 96, as shown in FIGS. 12A-12B. The liner layer 98 is conformally formed on the CESL 96, but prior to forming an interlayer dielectric (ILD) layer. The liner layer 98 is believed to assist adjusting the overall film stack stress level, so as to modulate the device electrical performance. The liner layer 98 may also serve as a buffer layer among the CESL 96, the isolation structure 78, and the active regions, such as source/drain regions 92, so that the stress constraint among these different regions (isolation regions v.s. active regions) and layers formed nearby may be released after an annealing process performed at operation 124, which will be described in greater detail below. Furthermore, the liner layer 98 may also serve as a blocking layer so that the water, steam, or moisture from the spacer features 86 or from the subsequent processes, if any, may be efficiently blocked to prevent water, steam, or moisture from penetrating into the neighboring active regions, such as source/drain regions 92 or conductive features (e.g., contacts) subsequently formed, which may adversely affect the device electrical performance. Additionally, the liner layer 98 may also serve as an etching stop enhancing layer so as to assist the process control of the etching and/or patterning process to efficiently stop on the CESL 96.

In one example, the liner layer 98 may be a silicon containing layer formed by an ALD, CVD, thermal furnace, or any suitable deposition process. The liner layer 98 may be a nitrogen free material, such as a nitrogen free silicon containing layer. In one particular example, the liner layer 98 may be an amorphous silicon layer, a crystalline silicon layer, or any suitable silicon containing material formed by a thermal furnace process. In one example, the deposition process time may be controlled in a range from about 30 minutes to about 300 minutes. The liner layer 98 has a thickness in a range from about 5 Å to about 200 Å, such as from about 10 Å to about 150 Å, for example about 20 Å. The temperature for the furnace deposition process for forming the liner layer 98 may be controlled in a range from about 300 degrees Celsius to about 800 degree Celsius, for example from about 400 degrees Celsius to about 600 degrees Celsius, such as about 500 degrees Celsius.

Figure 13A:
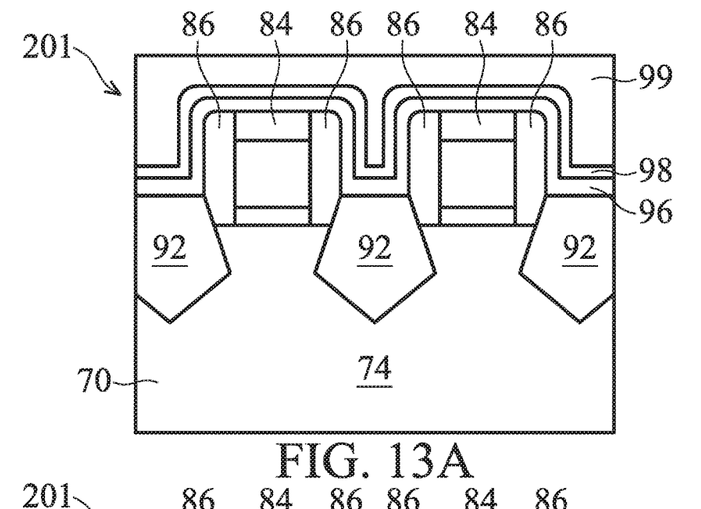
Figure 13B:
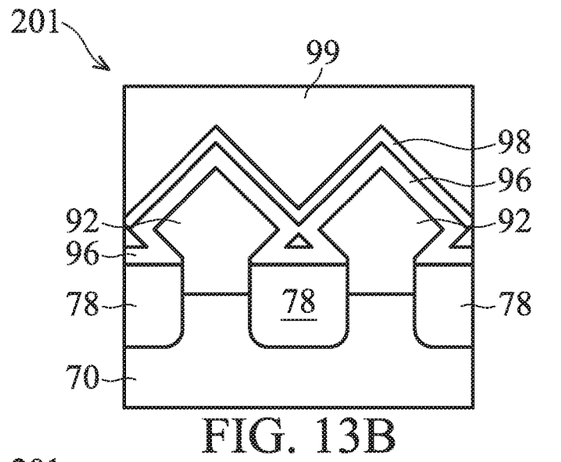

At operation 122, after the liner layer 98 is formed on the substrate 70, an ILD layer 99 is formed over the liner layer 98, as shown in FIGS. 13A-13B. The ILD layer 99 may include materials such as tetraethylorthosilicate (TEOS) oxide, undoped silicate glass, doped silicon oxide such as borophosphosilicate glass (BPSG), fused silica glass (FSG), phosphosilicate glass (PSG), boron doped silicon glass (BSG), $SiO_xC_y$, Spin-On-Glass, Spin-On-Polymers, silicon carbon material, a compound thereof, a composite thereof, and/or other suitable dielectric materials. The ILD layer 99 may be deposited by a spin-on, CVD, FCVD, PECVD, PVD, or other suitable deposition technique. In an embodiment, the ILD layer 99 is formed by a flowable CVD (FCVD) process to fill between neighboring dummy gate structures 212. In one example, the ILD layer 99 is a silicon oxide layer with light hydrogen and nitrogen dopants formed therein. As the ILD layer 99 may have other dopants formed therein, the silicon oxide layer of the ILD layer 99 may have an silicon to oxygen ratio (Si:O) slightly less than 1:2, such as from about 1:1.6 and about 1:1.8.

Figure 14A:
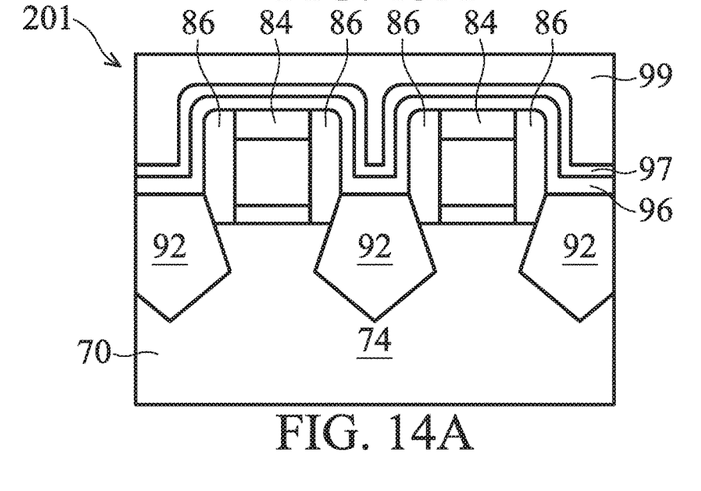
Figure 14B:
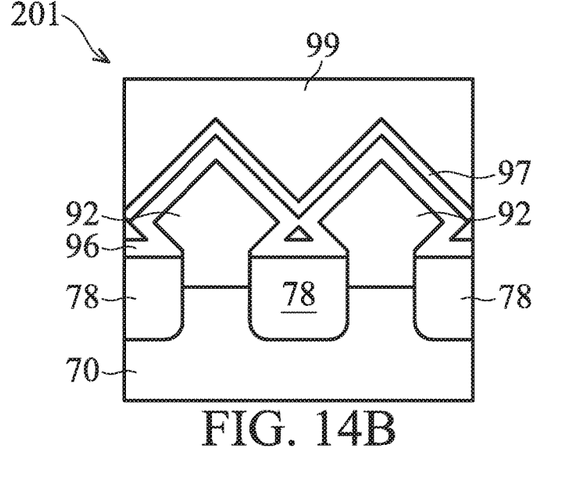

At operation 124, an annealing process is performed. The thermal energy provided from the annealing process may densify and enhance the bonding structures of the liner layer 98 and the ILD layer 99. Thus, the dangling oxygen bonds from the ILD layer 99 may then react with the dangling silicon bonds from the liner layer 98, converting the liner layer 98 into a liner oxide layer 97, as shown in FIGS. 14A-14B. The excess and/or unreacted oxygen elements from the ILD layer 99 may be driven to react with the silicon (e.g., amorphous silicon) from the liner layer 98, thus forming the liner oxide layer 97, such as a silicon oxide layer, between the ILD layer 99 and the CESL 96. In some examples wherein the ILD layer 99 is formed from a flowable CVD process, excess amount of oxygen elements may be found due to the relatively highly moisture level during the deposition process, as the precursor source from the flowable CVD process is often liquid/solution based. Thus, by utilizing the annealing process at operation 124, unreacted, excess, or dangling bonds of the oxygen elements may be efficiently driven and drifted to react with the silicon elements from the liner layer 98 so as to convert the liner layer 98 into a liner oxide layer 97, such as a silicon oxide containing layer.

Thus, after the liner layer 98 is converted to the liner oxide layer 97, the liner oxide layer 92 may have a silicon to oxygen ratio (Si:O) around 1:2, such as from about 1:1.8 to about 1:2. As the liner layer 98 is formed from an amorphous silicon layer without other dopants, a relatively pure film structure may be found for the liner oxide layer 97 that comprises dominantly silicon and oxygen. Thus, the ratio of oxygen concentration level to silicon concentration level for the liner oxide layer 97 (such as about O:Si about 1.8:1 to 2:1) is greater than the ratio of oxygen concentration level to silicon concentration level (such as about O:Si about 1.6:1 to 1.8:1) in the ILD layer 99 as other impurities, such as N, or H, in ILD layer 99 may share and occupy the bonding with oxygen, lowering the oxygen to silicon concentration ratio.

Furthermore, the thermal energy from the annealing process may also result in thermal expansion of the film structures of the spacer feature 86, the liner layer 98, the source/drain regions 92 and the ILD layer 99, assisting releasing localized stress strain at the interfaces wherein different materials are mated. As a result, a tensile stress induced by the liner layer 98 can become a compressive stress induced by the liner oxide layer 97 resulting from the furnace process. The compressive stress film structure is believed to provide a better film uniformity across the substrate surface and better adhesion to the underlying layer to avoid film stack peeling and crack. Thus, the likelihood of a current leaking issue due to the stress mismatch among the different layers at the film stack may be effectively eliminated. Additionally, a stress constraint, which may occur due to mismatched lattice structures or bonding structures at an interface with different materials, may also be effectively released or modulated by the atomic reconstruction or rearrangement by the thermal energy provided during the annealing process so the undesired current leakage may be minimized or eliminated.

Furthermore, during the thermal annealing process, lateral movement of the oxygen elements from the ILD layer 99 drifting toward the liner layer 98 may also assist re-packing the atomic structures of the film layers, thus releasing localized stress and strain as well, providing a compressive stress film structure as desired. Thus, the liner oxide layer 97 may be formed as a film stack stress modulator so as to efficiently adjust the overall stress level in the interlayer dielectric (ILD) structure.

In one example, the thermal annealing process may be performed in a thermal annealing chamber or any suitable enclosure that may provide thermal energy to the substrate. During the process, the process temperature may be controlled up to 800 degrees Celsius. In one example, the process temperature may be controlled in a range from about 300 degrees Celsius to about 700 degrees Celsius, such as about 600 Celsius during the thermal annealing process.

In one embodiment, the thermal annealing process may be performed in-situ in the processing chamber wherein the deposition processes at operation 120 or 122 was performed. During annealing, an annealing gas mixture may be supplied. Gases that may be supplied in the annealing gas mixture may include an oxygen containing gas, such as $O_2$, $O_3$, $N_2O$, water steam ($H_2O$), $CO_2$, CO and the like. In one specifically example, the annealing gas mixture may include water steam ($H_2O$).

In one example, after the thermal annealing process, the liner oxide layer 97 may have a relatively thicker thickness, as compared to the liner layer 98, in a range from about 20 Å to about 300 Å, such as from about 30 Å to about 180 Å, such as about 50 Å, resulted from the thermal expansion and oxidation during the annealing process.

Figure 15A:
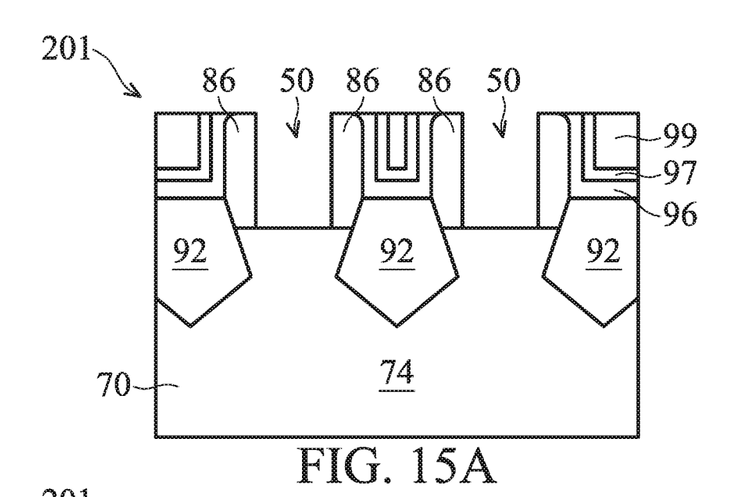
Figure 15B:
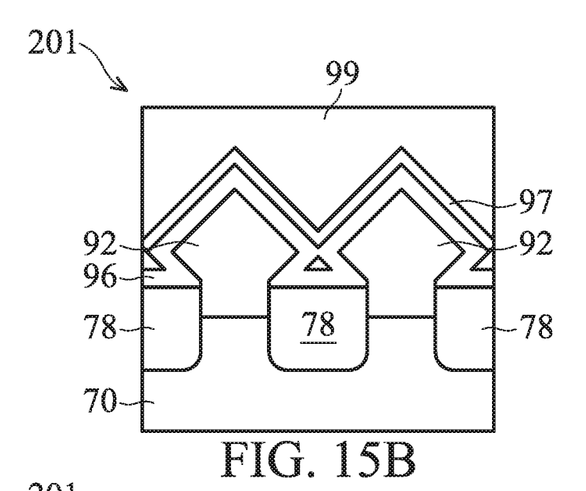
Figure 16A:
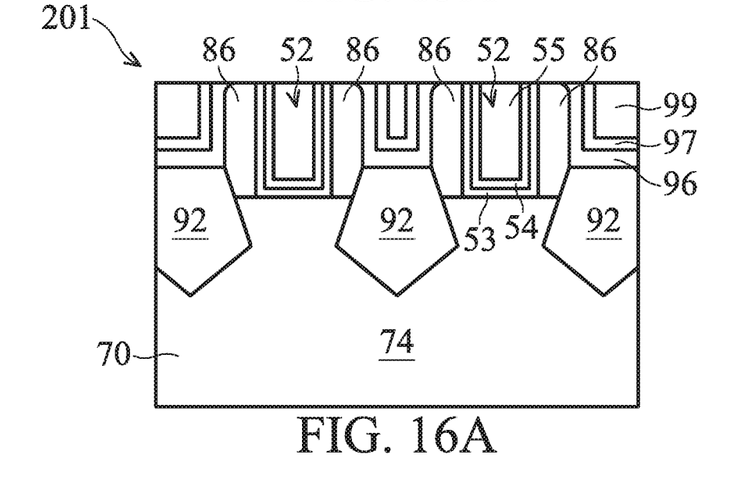
Figure 16B:
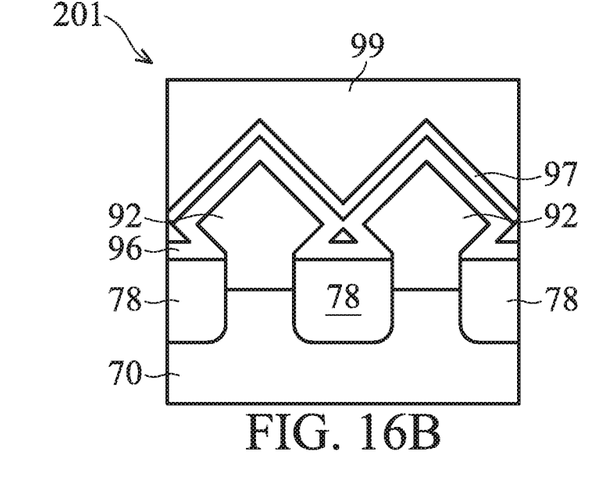

It is noted that after the thermal annealing process, the ILD layer 99 may be planarized, such as by a CMP, to provide a planar surface. Subsequently, the dummy gate structure 212 may removed from the substrate 70 to define an opening 50 in the ILD layer 99 as depicted in FIGS. 15A-15B, which may later allow a replacement gate structure 52, such as a metal gate structure, to be formed therein to continue manufacturing the semiconductor device structure 201, as shown in FIGS. 16A-16B. In one example, the replacement gate structure 52 may include an interfacial layer (not shown), a high dielectric constant dielectric layer 53, a work function tuning layer 54, and a metal electrode structure 55 formed therein to form a metal gate structure, as shown in FIGS. 16A-16B.

Although not intended to be limiting, one or more embodiments of the present disclosure provide many benefits to a semiconductor device and the formation thereof. For example, embodiments of the present disclosure provide methods for forming a liner layer between a CESL and an ILD layer. The liner layer may serve as a stress modulating layer, a blocking layer or a barrier layer that efficiently enhance the electrical performance of the semiconductor devices on the substrate. The liner layer may be first formed by an amorphous silicon layer and later converted as a liner oxide layer by a thermal annealing process. The conversion of the liner layer to the liner oxide layer may also enable local stress alternation so as to release stress strain at the film stack interface so as to provide a better film structure integration and adhesion.

In embodiment, a semiconductor device includes an active area on a substrate, the active area comprising a source/drain region, a gate structure over the active area, the source/drain region being proximate the gate structure, a spacer feature along a sidewall of the gate structure, a contact etching stop layer on the spacer feature, a liner oxide layer on the contact etching stop layer, and an interlayer dielectric layer on the liner oxide layer, wherein the liner oxide layer has an oxygen concentration level greater than interlayer dielectric layer. In an embodiment, the liner oxide layer has a silicon to oxygen ratio from about 1:1.8 to about 1:2. In an embodiment, the interlayer dielectric layer has a silicon to oxygen ratio from about 1:1.6 to about 1:1.8. In an embodiment, the liner oxide layer is a silicon oxide containing layer. In an embodiment, the gate structure comprises a metal gate structure including a metal gate electrode on a high dielectric constant layer. In an embodiment, the liner oxide layer has a thickness in a range of from about 20 Å to 300 Å. In an embodiment, the contact etching stop layer is a silicon nitride containing material.

In another embodiment, a method for forming a semiconductor device includes forming a liner layer on a contact etching stop layer on a substrate having a gate structure formed thereon, wherein the liner layer comprises a nitrogen free material, and forming an interlayer dielectric layer on the liner layer, wherein the liner layer and the interlayer dielectric layer comprises different film materials. In an embodiment, the liner layer is an amorphous silicon layer. In an embodiment, a thermal annealing process is performed on the substrate. In an embodiment, an annealing gas mixture is supplied while performing the thermal annealing process, wherein the annealing gas mixture further comprises water steam. In an embodiment, the liner layer is converted into an oxide containing layer. In an embodiment, the oxide containing layer has an oxygen concentration greater than the interlayer dielectric layer. In an embodiment, the liner layer is converted to a silicon oxide layer. In an embodiment, the liner layer is formed by performing a furnace deposition process on the substrate to form the liner layer.

In yet another embodiment, a method for forming a semiconductor device includes forming a liner layer on a contact etching stop layer on a substrate having a gate structure formed thereon, and converting the liner layer into a liner oxide layer by a thermal annealing process. In an embodiment, an interlayer dielectric layer is formed on the liner layer prior to converting the liner layer into the liner oxide layer. In an embodiment, the liner oxide layer has an oxygen concentration greater than the interlayer dielectric layer. In an embodiment, the thermal annealing process provides oxygen elements to the liner layer. In an embodiment, the liner layer is an amorphous silicon layer and the liner oxide layer is a silicon oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   an active area on a substrate, the active area comprising a source/drain region;
   a gate structure over the active area, the source/drain region being proximate the gate structure;
   a spacer feature along a sidewall of the gate structure;
   a contact etching stop layer on the spacer feature;
   a liner oxide layer on the contact etching stop layer, wherein the line oxide layer is free of hydrogen; and an interlayer dielectric layer on the liner oxide layer, wherein the liner oxide layer has an oxygen concentration level greater than the interlayer dielectric layer, wherein the interlayer dielectric layer has a silicon to oxygen ratio from about 1:1.6 to about 1:1.8, and wherein the interlayer dielectric layer has a higher hydrogen concentration than the liner oxide layer.

2. The semiconductor device of claim 1, wherein the liner oxide layer has a silicon to oxygen ratio from about 1:1.8 to about 1:2.

3. The semiconductor device of claim 1, wherein the liner oxide layer is a silicon oxide containing layer.

4. The semiconductor device of claim 1, wherein the gate structure comprises a metal gate structure including a metal gate electrode on a high dielectric constant layer.

5. The semiconductor device of claim 1, wherein the liner oxide layer has a thickness in a range of from about 20 Å to 300 Å.

6. The semiconductor device of claim 1, wherein the contact etching stop layer is a silicon nitride containing material.

7. A method for forming a semiconductor device, comprising:
forming a liner layer on a contact etching stop layer on a substrate having a gate structure formed thereon, wherein the liner layer comprises a nitrogen free material;
forming an interlayer dielectric layer over the liner layer, wherein the liner layer and the interlayer dielectric layer comprises different film materials, and wherein forming the interlayer dielectric layer comprises forming the interlayer dielectric layer to comprise an excess amount of oxygen and to be free of hydrogen; and
diffusing the excess amount of oxygen from the interlayer dielectric layer into the liner layer to convert the liner layer into an oxide containing layer, wherein diffusing the excess amount of oxygen from the interlayer dielectric layer into the liner layer comprises a thermal annealing process, and wherein after the thermal annealing process, a hydrogen concentration of the interlayer dielectric layer is greater than a hydrogen concentration of the oxide containing layer.

8. The method of claim 7, wherein the liner layer is an amorphous silicon layer.

9. The method of claim 7, further comprising:
supplying an annealing gas mixture while performing the thermal annealing process, wherein the annealing gas mixture further comprises water steam.

10. The method of claim 7, wherein the oxide containing layer has an oxygen concentration greater than the interlayer dielectric layer.

11. The method of claim 7, wherein the liner layer is converted to a silicon oxide layer.

12. The method of claim 7, wherein forming the liner layer further comprises:
performing a furnace deposition process on the substrate to form the liner layer.

13. The method of claim 7, wherein the excess amount of oxygen comprises unreacted oxygen or dangling oxygen bonds.

14. The method of claim 7, wherein the thermal annealing process further results in thermal expansion of the interlayer dielectric layer.

15. A method for forming a semiconductor device, comprising:
forming a liner layer on a contact etching stop layer on a substrate having a gate structure formed thereon;
converting the liner layer into a liner oxide layer by a thermal annealing process, wherein converting the liner layer into the liner oxide layer by the thermal annealing process further comprises changing a first stress induced by the liner layer to a second stress induced by the liner oxide layer, the first stress is a different type of stress than the second stress; and
forming an interlayer dielectric layer on the liner layer prior to converting the liner layer into the liner oxide layer, wherein the liner layer is free of hydrogen and nitrogen, and wherein the interlayer dielectric layer has a higher concentration of hydrogen and a higher concentration of nitrogen than the liner oxide layer.

16. The method of claim 15, wherein the first stress is tensile stress, and the second stress is compressive stress.

17. The method of claim 15, wherein the liner oxide layer has an oxygen concentration greater than the interlayer dielectric layer.

18. The method of claim 17, wherein the thermal annealing process provides oxygen elements to the liner layer.

19. The method of claim 17, wherein the liner layer is an amorphous silicon layer and the liner oxide layer is a silicon oxide layer.

* * * * *